| United States Patent [19] | [11] Patent Number: 4,883,740 |
|---|---|
| Schwalm et al. | [45] Date of Patent: Nov. 28, 1989 |

[54] RADIATION-SENSITIVE MIXTURE FOR PHOTOSENSITIVE COATING MATERIALS

[75] Inventors: Reinhold Schwalm, Wachenheim; Andreas Boettcher, Nussloch; Horst Binder, Lampertheim, all of Fed. Rep. of Germany

[73] Assignee: BASF Aktiengesellschaft, Ludwigshafen, Fed. Rep. of Germany

[21] Appl. No.: 219,689

[22] Filed: Jun. 30, 1988

[51] Int. Cl.$^4$ .................. G03C 1/495; G03C 5/16; G03C 5/00

[52] U.S. Cl. .................. 430/270; 430/910; 430/905; 430/914; 430/921; 430/326; 430/330; 522/25; 522/31

[58] Field of Search ............... 430/270, 910, 905, 914, 430/921, 326, 330; 522/25, 31

[56] References Cited

U.S. PATENT DOCUMENTS

| 3,915,706 | 10/1975 | Limburg et al. | 96/27 R |
|---|---|---|---|
| 4,058,400 | 11/1977 | Crivello | 96/86 P |
| 4,210,449 | 7/1980 | Schlesinger et al. | 430/183 |
| 4,491,628 | 1/1985 | Ito et al. | 430/176 |
| 4,678,737 | 7/1987 | Schneller et al. | 430/270 |
| 4,689,288 | 8/1987 | Buiguez et al. | 430/270 |

FOREIGN PATENT DOCUMENTS

| 0130599 | 1/1985 | European Pat. Off. | 430/270 |
|---|---|---|---|
| 62-38450A | 2/1989 | Japan | 430/270 |

OTHER PUBLICATIONS

Highly-Sensitive Novolak-Based Positive X-Ray Resist, Dossell et al. Microcircuit Engineering, Interlaken 1986.

Applications of Photoinitiated Cationic Polymerization Toward the Development of New Photoresist, Crivello, Polym. Sci., 48,5.65–69 (1985).

M. T. Goosey, Elsevier Appl. Sci. Pub., London, S. 218–221 (1985).

Photoinitiated Cationic Polymerization by Dialkyl-4-Hydroxyphenylsulfonium Salts, Crivello et al., Journal of Polymer Science: Polymer Chemistry Ed. vol. 18 1021–1034 (1980).

*Primary Examiner*—Paul R. Michl
*Assistant Examiner*—Cynthia Hamilton
*Attorney, Agent, or Firm*—Keil & Weinkauf

[57] ABSTRACT

A radiation-sensitive mixture consists of a polymeric binder which is insoluble in water but soluble in aqueous alkaline solutions, and of an organic compound whose solubility in an aqueous alkaline developer is increased by the action of an acid and which contains both one or more acid-cleavable groups and a group which forms a strong acid under the action of radiation.

The radiation-sensitive mixture is suitable for use in photosensitive coating materials for the production of relief patterns and relief images.

17 Claims, No Drawings

RADIATION-SENSITIVE MIXTURE FOR PHOTOSENSITIVE COATING MATERIALS

The present invention relates to radiation-sensitive mixtures which contain a polymeric binder which is insoluble in water but soluble in aqueous alkaline solutions, and an organic compound which contains one or more acid-cleavable bonds and forms a strong acid under the action of radiation, the solubility of this organic compound in an aqueous alkaline solvent being increased by the action of the acid. The mixtures are sensitive to UV radiation, electron radiation and X-rays and are particularly suitable as positive working resist materials.

Positive working radiation-sensitive mixtures are known. Positive working resist materials which contain o-quinonediazides in aqueous alkaline binders, eg. novolaks or poly-(p-vinylphenol), are used commercially as photoresists. The sensitivity of these systems to radiation is, however, unsatisfactory in some cases.

A dramatic increase in sensitivity in radiation-sensitive systems is obtained when a species is produced in the primary photoreaction and the said species, independently of the radiation, then initiates a catalytic secondary reaction and thus increases the quantum yield to values above 1.

Such systems which photochemically produce a strong acid which then cleaves acid-labile groups in a secondary reaction are disclosed in, for example, U.S. Pat. No. 3,915,706 for positive working polyaldehydes.

Radiation-sensitive mixtures based on acid-cleavable compounds which contain, as a binder, a polymer which is soluble in aqueous alkaline media, and a compound which forms a strong acid by a photochemical reaction, and a further compound which possesses acid-cleavable bonds are also known (cf. DE-A 34 06 927). Such three-component systems are also disclosed in the literature as X-ray resists (cf. for example K. Dossel et al., Microcircuit Engineering, Interlaken 1986).

Radiation-sensitive two-component mixtures of polymers having acid-labile side groups and photochemical acid donors are disclosed in, for example, U.S. Pat. No. 4,491,628 and French Pat. No. 2,570,844. However, these polymeric binders are hydrophobic and do not become alkali-soluble until after exposure.

The use of onium salts as photochemical acid donors is known, for example, from applications as cationic polymerization initiators (U.S. Pat. Nos. 4,058,400 and 4,210,499) and, in the abovementioned U.S. Pat. No. 4,491,628, in resist materials. An overview of the use in resist materials is given by Crivello in Org. Coatings and Appl. Polym. Sci., 48 (1985), 65–69.

It is an object of the present invention to provide novel radiation-sensitive systems having high photoreactivity for the production of relief structures, the said systems having a very small number of components and exhibiting photoreactivity in a very wide range of the spectrum of electromagnetic waves.

We have found that this object is achieved and that, surprisingly, it is possible to synthesize compounds which have acid-labile groups in the molecule and also form, on exposure to radiation, a strong acid which cleaves the acid-labile groups and thus dramatically changes the solubility properties of this compound. In combination with a film-forming alkali-soluble binder, this gives very advantageous systems for the production of relief structures.

The present invention relates to radiation-sensitive mixtures containing (a) a polymeric binder which is insoluble in water but soluble in aqueous alkaline solutions and (b) an organic compound whose solubility in an aqueous alkaline developer is increased by the action of an acid and which contains one or more acid-cleavable groups, wherein the organic compound (b) additionally contains a group which forms a strong acid under the action of radiation.

Suitable polymeric binders (a) are both phenolic resins, eg. novolaks, poly-(p-hydroxystyrene), poly-(p-hydroxymethylstyrene) or copolymers of p-hydroxystyrene or p-hydroxymethylstyrene, and copolymers containing carboxyl groups, eg. methyl methacrylate/methacrylic acid copolymers.

Preferred organic compounds (b) are those which contain one or more onium salt groups and one or more tert-butyl carbonate groups or one or more silyl ether groups.

Particularly preferred organic compounds (b) of this type are those of the general formula (I)

where $R^1$, $R^2$ and $R^3$ are identical or different and are aliphatic and/or aromatic radicals which may contain hetero atoms, or two of the radicals $R^1$ to $R^3$ are bonded to one another to form a ring, with the proviso that one or more of the radicals $R^1$ to $R^3$ contain one or more acid-cleavable groups, and one of the radicals $R^1$ to $R^3$ may be bonded to one or more further sulfonium salt radicals, if desired via acid-cleavable groups, and $X^\ominus$ is a non-nucleophilic counter-ion, eg. dimethyl-4-tert-butoxycarbonyloxyphenylsulfonium salt with hexafluoroarsenate, hexafluoroantimonate, hexafluorophosphate and/or tetrafluoborate as a counter-ion, phenyl-bis-(4-tert-butoxycarbonyloxyphenyl)-sulfonium salt with hexafluoroarsenate, hexafluoroantimonate, hexafluorophosphate and/or tetrafluoborate as a counter-ion, tris-(4-tert-butoxycarbonyloxyphenyl)-sulfonium salt with hexafluoroarsenate, hexafluoroantimonate, hexafluorophosphate and/or tetrafluoborate as a counter-ion or 1-naphthyl-4-trimethylsilyloxytetramethylenesulfonium salt with hexafluoroarsenate, hexafluoroantimonate, hexafluorophosphate and/or tetrafluoborate as a counter-ion.

The present invention also relates to the use of these radiation-sensitive mixtures in photosensitive coating materials, and to a process for the production of relief patterns and relief images, wherein a novel radiation-sensitive mixture is used as the photosensitive coating material and is heated to 60°–120° C. after exposure.

Radiation-sensitive mixtures according to the invention thus essentially consist of a polymeric binder (a), which is insoluble in water but soluble in aqueous alkaline solvents, and an organic compound (b) which contains acid-cleavable groups and forms a strong acid on exposure. This radiation-sensitive mixture can be applied, for example in the form of a thin film, to a substrate and can be heated under controlled conditions to remove the residual solvent, exposed imagewise and again heated under controlled conditions. The solubility of the imagewise exposed parts is changed by this treatment in such a way that complete removal of material takes place with aqueous alkaline solutions which may contain polar solvents, eg. isopropanol, whereas the unexposed parts exhibit only slight removal of material.

The novel radiation-sensitive mixtures are sensitive to X-rays, electron radiation and short-wavelength UV radiation and can be sensitized into the range of visible light by adding a sensitizer. In the short-wavelength UV range (<300 nm), sulfonium compounds are particularly preferably used since their absorption maxima are below 300 nm.

Regarding the components of the novel radiation-sensitive mixture, the following may be stated specifically.

All polymers which are insoluble in water but soluble or dispersible in an aqueous alkaline medium can be used as polymeric binders (a), although polymers of this type which have a high content of aromatic groups, such as novolaks, for example those based on phenol/-formaldehyde, as described, for example, in Plastics for Electronics, M. T. Goosey, Elsevier Appl. Sci. Publ. London, pages 220 and 302 (1985), poly-(p-hydroxystyrene), poly-(p-hydroxymethylstyrene) and copolymers of p-hydroxystyrene and/or p-hydroxymethylstyrene with other monomers, for example styrenes, (meth)acrylonitrile, (meth)acrylic acid and esters thereof, are preferably employed. The polymeric binders (a) having a high aromatic content have the advantage that they are relatively stable in plasma etching and reactive ion etching processes.

According to the present invention, all organic compounds (b) which form an acid on exposure and contain acid-labile groups can be used in combination with a polymeric binder (a) which is soluble in an alkaline medium; however, onium salts are preferred, in particular sulfonium salts of the general formula (I)

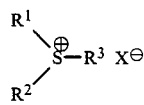

where $R^1$, $R^2$ and $R^3$ are identical or different and are aromatic and/or aliphatic radicals which may contain hetero atoms, with the proviso that one or more of the radicals $R^1$ to $R^3$ contains an acid-cleavable group, for example tert-butyl carbonates of phenols or silyl ethers of phenols. These acid-labile groups are preferred, but a large number of other acid-labile groups, such as the known orthoesters, trityl and benzyl groups and tert-butyl esters of carboxylic acids can also be used. It is also possible for two or more sulfonium units to be bonded in the molecule via the radicals $R^1$ to $R^3$. The organic compounds (b) are generally used in amounts of from 5 to 75, preferably from 10 to 50, % by weight, and the polymeric binder (a) in amounts of from 25 to 95, preferably from 50 to 90, % by weight, based on the total amount of the radiation-sensitive mixture.

Preferred sulfonium salts of the general formula (I)

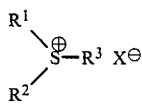 (I)

are those in which $R^1$ and $R^2$ are each methyl and $R^3$ is a substituted phenyl derivative having acid-cleavable groups, ie.

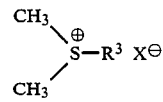

where $R^3$ is, for example, 4-tert-butoxycarbonyloxyphenyl, 4-tert-butoxycarbonyloxy-3,5-dimethylphenyl, 4-tert-butoxycarbonyloxy-3-methylphenyl, 4-tert-butoxycarbonyloxy-2-methylphenyl, 4-tert-butoxycarbonyloxy-3,5-dimethoxyphenyl, 4-tert-butoxycarbonyloxy-3,5-diphenyl-phenyl, 1-tert-butoxycarbonyloxynaphthyl, 4-trimethylsilyloxyphenyl or 4-trimethylsilyloxynaphthyl, or those in which two of the radicals $R^1$ to $R^3$ are bonded to one another to form a ring, in particular a 5-membered or 6-membered ring, $R^1$ and $R^2$ forming, for example, a tetramethylene bridge, and $R^3$ has the same meaning as above:

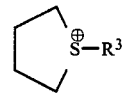

or compounds in which $R^1$ is methyl, $R^2$ is phenyl or tolyl and $R^3$ is a substituted phenyl derivative having acid-cleavable groups, such as

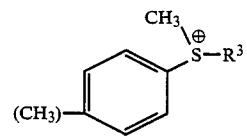

where $R^3$ is, for example, 4-tert-butoxycarbonyloxyphenyl, 2,4-di-tert-butoxycarbonyloxyphenyl, 4-tert-butoxycarbonyloxy-2-methoxyphenyl or 4-trimethylsilylphenyl, or where $R^1$ is phenyl or $C_1$–$C_{12}$-substituted phenyl or halogen-substituted phenyl and $R^2$ and $R^3$ are each a substituted phenyl derivative having acid-cleavable groups, eg.

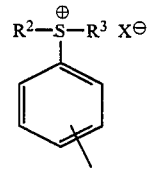

where $R^2$ and $R^3$ are each, for example, 4-tert-butoxycarbonyloxyphenyl, 4-trimethylsilyloxyphenyl, 4-tert-butyldimethylsilyloxyphenyl or 4-tert-butoxycarbonyloxy-3,5-dimethylphenyl, or $R^1$, $R^2$ and $R^3$ are identical, ie. sulfonium salts (b) which contain three of these radicals having acid-cleavable groups.

Other suitable compounds of the general formula (I) are those in which one of the radicals $R^1$ to $R^3$ is bonded to one or more further sulfonium salt radicals, if desired via acid-cleavable groups, ie. compounds which thus likewise contain a plurality of sulfonium groups in the molecule, eg.

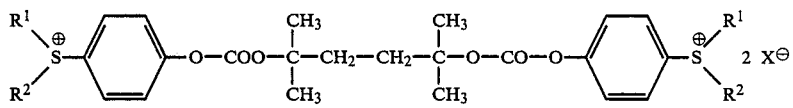

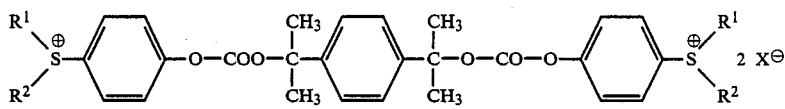

In addition to the sulfonium salts, iodonium salts, eg.

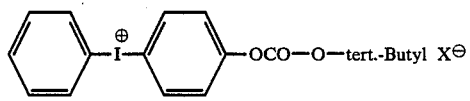

are also suitable. Suitable counter-ions are preferably complex metal halides, such as tetrafluoborate, hexafluoroantimonate, hexafluoroarsenate and hexafluorophosphate, although the invention is not restricted to these specific counter-ions or to the stated compounds having acid-cleavable groups; instead, it is possible to use all compounds which form a strong acid on exposure and contain an acid-cleavable bond in the same molecule.

The organic compounds (b) can be prepared by the known methods of organic chemistry for the synthesis of esters, ethers and carbonates, by starting from the sulfonium salts having phenolic groups and converting these salts to derivatives. Sulfonium salts with phenolic groups can be reacted with potassium tert-butylate, after which the acid-cleavable group can be introduced by means of di-tert-butyl dicarbonate, or alternatively the phenolic sulfonium salt can be reacted with an activated carbonyl compound, eg. tert-butyloxycarbonyl-N-imidazole. Hydroxyphenylsulfonium salts which already contain a nonnucleophilic anion, eg. hexafluoroarsenate or hexafluoroantimonate, are particularly suitable for this reaction. Such compounds can be prepared, for example, by a synthesis method in J. Polym. Sci., Chem. Ed. 18 (1980), 1021. For example, it is possible to dissolve the resulting compounds in dry tetrahydrofuran, add potassium tert-butylate in dry tetrahydrofuran and then add dropwise a solution of di-tert-butyl dicarbonate in tetrahydrofuran. Working up and recrystallization then give the pure sulfonium salt having acid-labile groups.

In the novel process for the production of relief patterns, a radiation-sensitive recording layer which essentially consists of the novel radiation-sensitive mixture, is exposed imagewise to a dose such that the solubility of the exposed parts in aqueous alkaline solvents increases and these exposed parts can be selectively removed with the alkaline developer. For this purpose, the compounds which have acid-cleavable groups and, on exposure, produce a strong acid which catalytically eliminates the acid-labile groups and hence increases the solubility of the compound in alkaline developers are used in combination with an alkaline binder.

Preferably, for example, the polymer binder (a) and 25% by weight, based on the solids content of the radiation-sensitive mixture, of a novel onium salt (b) are dissolved in methylglycol acetate or methylpropylene glycol acetate, the solids content being from 10 to 30% by weight. The solution can be filtered through a filter having a pore diameter of 0.2 μm. By applying the resist solution by spin coating at speeds of from 1,000 to 10,000 rpm, a resist film is produced on a silicon wafer. The wafer is then heated at 90° C. or 80° C. for from 1 to 5 minutes. The films are then exposed to UV light from a high pressure mercury lamp, to excimer laser light, to electron radiation or to X-rays through a chromium-plated structured quartz mask. The exposed films are heated at from 60° to 100° C. for from 5 seconds to 2 minutes. The films treated in this manner are then developed with an alkaline or alcoholic developer, the exposed parts selectively dissolving while only slight removal of material takes place in the unexposed parts.

If necessary, small amounts of sensitizers may be added in order to sensitize the compounds in the longer-wavelength UV range to the visible range. Polycyclic aromatics, such as pyrene and perylene, are preferred, although it is also possible to use other dyes which act as sensitizers.

In the Examples which follow, parts and percentages are by weight, unless stated otherwise.

Synthesis of dimethyl-4-tert-butoxycarbonyloxyphenylsulfonium hexafluoroarsenate Dimethyl-4-hydroxyphenylsulfonium hexafluoroarsenate is prepared according to the synthesis method in J. Polym. Sci., Polym. Chem. Ed. 18 (1980), 1021. The sulfonium chloride is first obtained from phenol and dimethyl sulfoxide in methanol while dry HCl is passed through, and the sulfonium chloride is then converted in a subsequent methathesis reaction with potassium hexafluoroarsenate into dimethyl-4-hydroxyphenylsulfonium hexafluoroarsenate.

2.0 parts of this salt are dissolved in 55 parts of dry tetrahydrofuran (THF) while passing through $N_2$. Thereafter, 1 part of potassium tert-butylate is added and stirring is then carried out for 10 minutes. A solution of 1.27 parts of di-tert-butyl dicarbonate in 10 parts of THF is added dropwise and stirring is continued for 1 hour. The reaction mixture is poured into 50 parts of ice water and extracted several times with ethyl acetate. The combined ethyl acetate fractions are dried over magnesium sulfate, and ethyl acetate is then stripped off. The crude product thus obtained is recrystallized twice from ethanol. The pure dimethyl-4-tert-butoxycarbonyloxyphenylsulfonium hexafluoroarsenate is obtained in a yield of 1.5 parts.

Test:

By NMR: 1.5 ppm (s, 9H): 3.3 ppm (s, 6H): 7.65 ppm and 8.15 ppm (para-substituted aromatics, each d, 4H) IR Ar-O-CO-O-aliph. 1760 cm$^{-1}$.

| Elemental analysis | C | H | S | As | F |
|---|---|---|---|---|---|
| Found | 35.0 | 4.3 | 7.6 | 16.7 | 25.4 |
| Calculated | 35.1 | 4.3 | 7.2 | 16.9 | 25.7 |

Dimethyl-4-tert-butoxycarbonyloxysulfonium hexafluoroarsenate is also obtained by reacting dimethyl-4-hydroxyphenylsulfonium hexafluoroarsenate (3.3 parts) with tert-butyl imidazole-N-carboxylate (1.9 parts) in 15 parts of THF. The reaction mixture is heated at 70° C. for 8 hours. After the mixture has cooled, the THF is distilled off and the residue is recrystallized from ethanol.

Other salts, such as hexafluoroantimonate and hexafluorophosphate, can also be prepared in a similar manner.

Synthesis of phenylbis-(4-tert-butoxycarbonyloxyphenyl)sulfonium hexafluoroarsenate 11.75 g (0.025 mole) of diphenyliodonium hexafluoroarsenate, 5.46 g (0.025 mole) of 4,4'-dihydroxydiphenyl sulfide and 0.2 g of copper(II) acetate are initially taken in a 100 ml two-necked flask equipped with a reflux condenser and a magnetic stirrer, N₂ being passed through. The mixture is heated under nitrogen at 125° C. for 3 hours and then poured into a beaker and extracted several times with diethyl ether. The crude product is recrystallized from chloroform/diethyl ether. The yield is 6.3 g. NMR and IR spectra show that the product thus prepared is phenylbis-(4-hydroxyphenyl)sulfonium hexafluoroarsenate.

6.3 g of the phenylbis-(4-hydroxyphenyl)sulfonium hexfluoroarsenate synthesized are dissolved in 100 ml of dry THF while N₂ is passed through. Thereafter 2.9 g of potassium tert-butylate are added and stirring is then continued for 10 minutes. 6.24 g of di-tert-butyl dicarbonate in 20 ml of THF are added dropwise and stirring is continued for a further hour. The reaction mixture is poured into 150 g of ice water and extracted several times with ethyl acetate. The combined ethyl acetate fractions are dried over magnesium sulfate and the solvent is stripped off. Recrystallization gives 7.0 g of pure phenylbis-(4-tert-butoxycarbonyloxyphenyl)-sulfonium hexafluoroarsenate.

NMR: 1.5 ppm (s, 18H): 7.5 ppm (d, 4H): 7.7 ppm (m, 5H) 7.8 ppm (d, 4H).

IR (C=O, carbonate) 1760 cm$^{-1}$.

Melting point: 128° C.

Synthesis of 4-(1-trimethylsilyloxynaphthyl)-tetrahydrothiophenium hexafluoroarsenate 5.3 parts of 4-(1-hydroxynaphthyl)-tetrahydrothiophenium hexafluoroarsenate are initially taken and 2 parts of hexamethyldisilazane are added dropwise at 25° C. in the course of 45 minutes. A further 4.5 parts of hexamethyldisilazane are added. The mixture is then allowed to react for 7 hours at 100° C. The excess hexamethyldisilazane is distilled off from the resulting yellow solution under reduced pressure from an oil pump. 6.5 parts of a yellow oil remain. The NMR spectrum corresponds to that of the expected silylated product.

Testing phenylbis-(4-tert-butoxycarbonyloxyphenyl)sulfonium hexafluoroarsenate The sulfonium salt is applied to a sodium chloride plate in yellow light and heated at 120° C. for 30 seconds. The IR spectrum shows a sharp carbonyl band at 1760 cm$^{-1}$ (carbonate) and no phenolic OH: there is no detectable change compared with the spectrum of the unheated substance. If the substance is now exposed to excimer laser light of wavelength 248 nm for 10 seconds and then heated at 120° C. for 30 seconds, the carbonyl band is found to have completely vanished and an OH band appears at 3,500 cm$^{-1}$.

EXAMPLE 1

A photoresist solution is prepared from 1.5 parts of the phenylbis-(4-tert-butyoxycarbonyloxyphenyl)sulfonium hexafluoroarsenate prepared as stated above, 1.5 parts of a novolak (based on cresol/formaldehyde, viscosity of 50% strength methanolic solution at 25° C.: 40-50 cps) and 7 parts of methylpropylene glycol acetate. The solution is then filtered through a filter having a pore diameter of 0.2 μm.

The resist solution is then applied to a silicon wafer having an SiO₂ film by spin coating at 3,510 rpm, a layer thickness of 1.00 μm being obtained. The wafer is dried for 1 minute at 90° C. and then brought into contact with an imagewise structured test mask and exposed for 10 seconds to excimer laser light of wavelength 248 nm. Thereafter, heating is carried out at 100° C. for 30 seconds and developing is effected with an alkaline developer of pH 13.12 for 5 seconds. The exposed parts are completely dissolved whereas removal of material from the unexposed parts is less than 5%. The resist patterns have a resolution of less than 1 μm.

EXAMPLE 2

A photoresist solution is prepared from 1 part of the phenylbis-(4-tert-butoxycarbonyloxyphenyl)-sulfonium hexafluoroarsenate prepared as stated above, 3 parts of the novolak (cf. Example 1) and 7 parts of methylpropylene glycol acetate. The solution is filtered through a filter having a pore diameter of 0.2 μm and is applied to a silicon wafer by spin coating at 6,000 rpm. After a heating time of 1 minute at 90° C., a layer thickness of 1.07 μm results.

After epxosure to excimer laser light of wavelength 248 nm for 10 seconds through a test mask brought into contact with the wafer surface, heating is carried out for 30 seconds at 100° C. followed by development with an alkaline developer of pH 13.0 for 15 seconds. The resist material is completely removed in the exposed areas, whereas no removal of material takes place in the unexposed areas. Resist patterns of good quality are formed.

EXAMPLE 3

A resist solution of 1.5 parts of phenylbis-(4-tert-butoxycarbonyloxyphenyl)-sulfonium hexafluoroarsenate, 1.5 parts of poly-(p-hydroxystyrene) (Polysciences, Inc.) and 7.0 parts of 2-methoxyethyl acetate is prepared and is filtered through a filter having a pore diameter of 0.2 μm. A 1 μm thick layer is applied to a silicon wafer, exposed to excimer laser light of wavelength 248 nm for 10 seconds through a test mask and then heated for 30 seconds at 100° C. The exposed parts can be selectively removed using 0.5% strength tetramethylammonium hydroxide solution.

EXAMPLE 4

The procedure described in Example 3 is followed, except that, instead of poly-(p-hydroxystyrene), a copolymer of 79% of methyl methacrylate and 21% of methacrylic acid ($\overline{M}_n$ 29,000) is used as the binder.

EXAMPLE 5

A small amount of perylene is added to the resist solution from Example 3, and a 1 μm thick film is likewise applied to a silicon wafer. After heating (for 1 minute at 90° C.), exposure is effected with a high pressure mercury lamp at a wavelength of about 365 nm for 2 minutes through the test mask, after which heating is carried out for 1 minute at 100° C. After development, resist patterns of good quality are formed.

EXAMPLE 6

The suitability of the novel radiation-sensitive mixtures as recording materials sensitive to electron radiation is demonstrated below:

A 1 μm thick resist layer of 1.5 parts of novolak and 1.5 parts of phenylbis-(4-tert-butoxycarbonyloxyphenyl)-sulfonium hexafluoroarsenate is applied by spin coating to a silicon wafer carrying a thin $SiO_2$ layer and is exposed to a dose of 20 μC/cm². After a heating step (postbake) of 30 seconds at 100° C., a development time of 10 seconds is sufficient completely to dissolve the exposed parts in an alkaline developer of pH 13.12.

We claim:

1. A radiation-sensitive mixture containing
   (a) a polymeric binder which is insoluble in water but soluble in aqueous alkaline solutions and
   (b) an organic compound whose solubility in an aqueous alkaline developer is increased by the action of an acid and which contains one or more acid-cleavable groups, wherein the organic compound (b) additionally contains one or more onium salt groups which form a strong acid under the action of radiation.

2. A radiation-sensitive mixture as defined in claim 1, wherein the polymeric binder (a) is a phenolic resin.

3. A radiation-sensitive mixture as defined in claim 2, wherein the phenolic resin is a novolak.

4. A radiation-sensitive mixture as defined in claim 2, wherein the phenolic resin is poly-(p-hydroxymethylstyrene) or a copolymer of p-hydroxystyrene or p-hydroxymethylstyrene.

5. A radiation-sensitive mixture as defined in claim 1, wherein the polymer binder (a) is a methyl methacrylate/methacrylate acid copolymer.

6. A radiation-sensitive mixture as sefined in claim 1, wherein the organic compound (b) contains one or more tert-butyl carbonate groups.

7. A radiation-sensitive mixture as defined in claim 1, wherein the organic compound (b) contains one or more silyl ether groups.

8. A radiation-sensitive mixture as defined in claim 1, which contains, as the organic compound (b), one or more compounds of the formula (I)

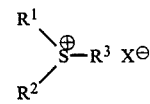

where $R^1$, $R^2$ and $R^3$ are identical or different and are aliphatic and/or aromatic radicals which may contain hetero atoms, or two of the radicals $R^1$ to $R^3$ are bonded to one another to form a ring, with the proviso that one or more of the radicals $R^1$ to $R^3$ contain one or more acid-cleavable groups, and one of the radicals $R^1$ to $R^3$ may be bonded to one or more further sulfonium salt radicals, and $X^{\ominus}$ is a non-nucleophilic counter-ion.

9. A radiation-sensitive mixture as defined in claim 1, wherein the organic compound (b) is a dimethyl-4-tert-butoxycarbonyloxyphenylsulfonium salt with hexafluoroarsenate, hexafluoroantimonate, hexafluorophosphate or tetrafluoborate as a counter-ion.

10. A radiation-sensitive mixture as claimed in claim 1, wherein the organic compound (b) is a phenylbis-(4-tert-butoxycarbonyloxphenyl)-sulfonium salt with hexafluoroarsenate, hexafluoroantimonate, hexafluorophosphate or tetrafluoborate as a counter-ion.

11. A radiation-sensitive mixture as defined in claim 1, wherein the organic compound (b) is a tris-(4-tert-butoxycarbonyloxyphenyl)-sulfonium salt with hexafluoroarsenate, hexafluoroantimonate, hexafluorophosphate or tetrafluoborate as a counter-ion.

12. A radiation-sensitive mixture as defined in claim 1, wherein the compound (b) is a 1-naphthyl-4-trimethylsilyloxytetramethylene-sulfonium salt with hexafluoroarsenate, hexafluoroantimonate, hexafluorophosphate or tetrafluoborate as a counter-ion.

13. A radiation-sensitive mixture as defined in claim 1, which contains from 25 to 95% by weight of the polymeric binder (a) and from 5 to 75% by weight of the organic compound (b).

14. A radiation-sensitive mixture as defined in claim 1, which additionally contains a sensitizer which absorbs radiation and transfers it to the organic compound (b).

15. A radiation-sensitive mixture as claimed in claim 14, wherein the sensitizer is perylene or pyrene.

16. A process for the production of a relief pattern or relief image which comprises:
    exposing a radiation-sensitive recording layer imagewise to sufficient radiation to increase the solubility of the exposed parts in aqueous alkaline solvents, said recording layer consisting essentially of
    (a) a polymeric binder which is insoluble in water but soluble in aqueous alkaline solutions and
    (b) an organic compound whose solubility in an aqueous alkaline developer is increased by the action of an acid and which contains one or more acid-cleavable groups, wherein the organic compound (b) additionally contains one or more onium salt groups which form a strong acid under the action of radiation, and thereafter applying an alkaline developer to the exposed layer to selectively remove the exposed parts.

17. A process for the production of a relief pattern as defined in claim 16, wherein exposure is followed by heating to 60°–120° C.

* * * * *

UNITED STATES PATENT AND TRADEMARK OFFICE
CERTIFICATE OF CORRECTION

PATENT NO. : 4,883,740

DATED : November 28, 1989

INVENTOR(S) : Reinhold SCHWALM et al.

It is certified that error appears in the above-identified patent and that said Letters Patent is hereby corrected as shown below:

ON THE COVER PAGE insert --Foreign Application Priority Data

July 1, 1987    Federal Republic of Germany   ...   3721741--

Column 9, line 56   "sefined" should read --defined--

Signed and Sealed this

Fourteenth Day of January, 1992

Attest:

HARRY F. MANBECK, JR.

Attesting Officer             Commissioner of Patents and Trademarks